US007839656B2

(12) United States Patent
Schack et al.

(10) Patent No.: US 7,839,656 B2
(45) Date of Patent: Nov. 23, 2010

(54) SHIELDED CIRCUIT ASSEMBLY AND METHOD

(75) Inventors: Göran Walter Schack, Ahus (SE); Gustav Fagrenius, Dalby (SE)

(73) Assignee: Sony Ericsson Mobile Communications AB, Lund (SE)

( * ) Notice: Subject to any disclaimer, the term of this patent is extended or adjusted under 35 U.S.C. 154(b) by 661 days.

(21) Appl. No.: 11/837,009

(22) Filed: Aug. 10, 2007

(65) Prior Publication Data
US 2008/0310135 A1 Dec. 18, 2008

Related U.S. Application Data

(60) Provisional application No. 60/944,436, filed on Jun. 15, 2007.

(51) Int. Cl.
*H05K 7/14* (2006.01)
*H05K 7/18* (2006.01)

(52) U.S. Cl. .................. 361/800; 361/816; 361/818

(58) Field of Classification Search .......... 361/800, 361/742, 758, 770, 804, 794, 816, 818; 439/76.1; 174/35 R, 51
See application file for complete search history.

(56) References Cited

U.S. PATENT DOCUMENTS

| | | | |
|---|---|---|---|
| 5,040,994 A * | 8/1991 | Nakamoto et al. ......... 439/76.1 |
| 6,172,881 B1 | 1/2001 | Hirai | |
| 6,249,442 B1 * | 6/2001 | Watanabe ................... 361/801 |
| 6,442,027 B2 * | 8/2002 | Sanada et al. .............. 361/704 |
| 6,466,447 B2 * | 10/2002 | Murowaki et al. .......... 361/752 |
| 6,618,268 B2 * | 9/2003 | Dibene et al. .............. 361/787 |
| 6,894,891 B2 * | 5/2005 | Darr et al. .................. 361/601 |
| 7,450,398 B2 * | 11/2008 | Oh et al. .................... 361/792 |
| 2005/0265650 A1 | 12/2005 | Priyadarshi et al. | |

FOREIGN PATENT DOCUMENTS

EP 1 633 173 A1 3/2006

OTHER PUBLICATIONS

International Search Report corresponding to PCT/IB2007/003888, mailed Jul. 25, 2008.
Written Opinion of the International Searching Authority corresponding to PCT/IB2007/003888, mailed Jul. 25, 2008.

* cited by examiner

*Primary Examiner*—Hung S Bui
(74) *Attorney, Agent, or Firm*—Renner, Otto, Boisselle & Sklar, LLP (57) ABSTRACT

A shielded circuit assembly includes first and second circuit support structure, e.g. circuit boards having electrical or electronic components thereon, flexible connection between the circuit support structures, e.g., a flexible printed circuit (FPC), flat flexible cable (FFC), or other connection, the first and second circuit support structures adapted for positioning in generally overlying spaced apart relation with the flexible connection providing electrical connection therebetween while having floor plans that tend to efficiently conserve space between the circuit support structures, and electromagnetic energy shielding adapted to provide shielding of space between the circuit support structures in such generally overlying spaced apart relation. A method of making a shielded circuit assembly includes folding one printed circuit board that is flexibly attached to another printed circuit board to a generally parallel spaced apart relation and providing shielding of space between the circuit boards.

29 Claims, 5 Drawing Sheets

SHIELDED CIRCUIT ASSEMBLY AND METHOD

This application claims the benefit of U.S. Provisional Patent Application Ser. No. 60/944,436, filed Jun. 15, 2007, which is incorporated herein by reference of its entirety.

TECHNICAL FIELD OF THE INVENTION

The present invention relates generally to shielding on printed circuit boards and, more particularly, to a shielded circuit assembly and to methods of making the same.

DESCRIPTION OF RELATED ART

In recent years, portable communication devices, such as mobile phones, personal digital assistants, mobile terminals, etc., continue to grow in popularity as have other electrical devices. The size of such devices constantly is being reduced. Also, electromagnetic energy shielding is used for various electrical devices.

SUMMARY

One aspect of the technology relates to a shielded circuit in which first and second circuit support portions are folded in a compact package, a flexible connection is provided between the circuit support portions, and electromagnetic energy shielding is provided.

Another aspect relates to a shielded circuit including a first circuit support structure, a second circuit support structure, a flexible connection between the circuit support structures, the first and second circuit support structures adapted for positioning in generally overlying spaced apart relation with the flexible connection providing electrical connection therebetween; and electromagnetic energy shielding adapted to provide shielding of space between the circuit support structures in such generally overlying spaced apart relation.

Another aspect relates to wherein at least one of said circuit supports is a printed circuit board.

Another aspect relates to wherein both of said circuit supports are printed circuit boards.

Another aspect relates to wherein said flexible connection comprises a flexible printed circuit.

Another aspect relates to wherein said flexible connection comprises a flexible printed circuit integral with at least one of said circuit supports.

Another aspect relates to wherein said flexible connection comprises a flexible flat cable.

Another aspect relates to wherein further comprising printed circuit traces on said circuit support structures.

Another aspect relates to wherein said circuit support structures comprising multi-layer circuit boards.

Another aspect relates to wherein at least a portion of at least one of said layers is a ground plane.

Another aspect relates to wherein said flexible connection includes a electrical conductors electrically connected to respective electrically conductive portions of said circuit support structures.

Another aspect relates to further comprising at least one electrical component on each of said circuit support structures.

Another aspect relates to wherein at least one of said circuit support structures has a plurality of electrical components thereon, and wherein the electrical components are located on said circuit support structures in relative relation to tend to minimize the spacing requirements between said circuit support structures.

Another aspect relates to wherein the form factors of at least two of said electrical components are different.

Another aspect relates to wherein the height dimension of at least one of said electrical components on one of said circuit support structures is greater than the height dimension of another of said electrical components on said one of said circuit support structures.

Another aspect relates to wherein the height dimension of at least one of said electrical components on the other of said circuit support structures is greater than the height dimension of another of said electrical components on said other of said circuit support structures.

Another aspect relates to wherein with the circuit support structures in spaced apart overlying relation such that electrical components said circuit support structures face each other, at least one electrical component having a relatively greater height dimension on one of said circuit support structures is at least partly aligned with an electrical component having a relatively smaller height dimension on the other of said circuit support structures.

Another aspect relates to wherein there are at least two electrical components having different height dimensions on each of said circuit support portions.

Another aspect relates to wherein said electromagnetic energy shielding comprises a shield plate.

Another aspect relates to wherein said shield plate positionable between said circuit support structures shielding space between said circuit support structures.

Another aspect relates to wherein said shield plate comprising a plurality of shield plates at least one at each of the sides of said circuit support structures.

Another aspect relates to wherein said shield plates comprising a shield plate at each of the sides and ends of said circuit support structures.

Another aspect relates to wherein said shielding comprising electrically conductive fencing.

Another aspect relates to wherein said shielding comprising electrically conductive plates.

Another aspect relates to wherein said shielding comprising electrically conductive strips of metal.

Another aspect relates to wherein said shielding comprising a conductive elastomer.

Another aspect relates to wherein said conductive elastomer comprising an elastomer material having therein electrically conductive particles.

Another aspect relates to wherein said elastomer being compressible to bring said particles in sufficient relative proximity to make the conductive elastomer electrically conductive.

Another aspect relates to wherein said conductive elastomer in sheet form, and further comprising a holder to hold said circuit support structures in relatively relation to compress said conductive elastomer to provide suitable electrical conductivity.

Another aspect relates to wherein said holder comprising resilient clips.

Another aspect relates to wherein electrically conductive traces or strips on at least one of said circuit support structures, and said shielding comprising an electrically conductive member electrically attached to at least one of said traces or strips.

Another aspect relates to wherein said shielding being soldered to at least one of said traces or strips.

Another aspect relates to wherein said shielding being welded to at least one of said traces or strips.

Another aspect relates to wherein said shielding being attached by adhesive to at least one of said traces or strips.

Another aspect relates to wherein said adhesive comprising electrically conductive adhesive.

Another aspect relates to wherein said shielding comprising at least one shield on each of said circuit support structures extending away from the respective circuit support structures and adapted for generally adjacent parallel alignment with respect to a corresponding shield on the other circuit support structure.

Another aspect relates to wherein there are at least two shields on each circuit support portion, the shields on one of said circuit support portions being proximate to and parallel to opposite side edges thereof.

Another aspect relates to wherein there are at least four shields on each circuit support portion.

Another aspect relates to wherein at least one circuit support structure is four sided.

Another aspect relates to wherein said one of said circuit support structures is larger than the other.

Another aspect relates to wherein at least one of the circuit support structures includes thereon an electrical component having a height up to 2.4 mm (millimeters).

Another aspect relates to wherein at least one of the circuit support structures includes thereon an ASIC.

Another aspect relates to wherein two circuit support structures and the flexible connection are formed in generally flat planar relation and are bent approximately 180 degrees to align the circuit support structures in generally parallel spaced apart overlying relation.

Another aspect relates to wherein a circuit component on at least one circuit support structure comprises a radio module.

Another aspect relates to wherein the shielded circuit is in an electronic communications device.

Another aspect relates to an electronic communications device employing one or more of the above aspects.

Another aspects relates to a mobile telephone employing a shielded circuit using one or more of the above aspects.

Another aspect relates to a method of making a shielded circuit assembly that includes first and second circuit support structures, a flexible connection therebetween, and shielding carried by at least one of the circuit support structures, including positioning the first and second circuit support structures in generally overlying spaced apart relation with the shielding providing electromagnetic energy shielding of at least some of the space between the first and second circuit support structures.

Another aspect relates to a method of making a shielded circuit assembly that includes a plurality of circuit support structures and a flexible connection between at least a pair of circuit support structures, including positioning at least two circuit support structures in generally overlying spaced apart relation and providing electromagnetic energy shielding of at least some of the space between the first and second circuit support structures.

Another aspect relates to a method including placing at least part of the shielding of one circuit support structure in spaced apart, generally parallel adjacent relation with counterpart shielding of the other circuit support structure.

These and further features of the present invention will be apparent with reference to the following description and attached drawings. In the description and drawings, particular embodiments of the invention have been disclosed in detail as being indicative of some of the ways in which the principles of the invention may be employed, but it is understood that the invention is not limited correspondingly in scope. Rather, the invention includes all changes, modifications and equivalents coming within the spirit and terms of the claims appended thereto.

Features that are described and/or illustrated with respect to one embodiment may be used in the same way or in a similar way in one or more other embodiments and/or in combination with or instead of the features of the other embodiments.

It should be emphasized that the term "comprises/comprising" when used in this specification is taken to specify the presence of stated features, integers, steps or components but does not preclude the presence or addition of one or more other features, integers, steps, components or groups thereof.

Many aspects of the invention can be better understood with reference to the following drawings. The components in the drawings are not necessarily to scale, emphasis instead being placed upon clearly illustrating the principles of the present invention. Likewise, elements and features depicted in one drawing or embodiment of the invention may be combined with elements and features depicted in one or more additional drawings or embodiments. Moreover, in the drawings, like reference numerals designate corresponding parts throughout the several views.

DESCRIPTION

In the detailed description that follows, like components have been given the same reference numerals regardless of whether they are shown in different embodiments of the present invention. To illustrate the present invention in a clear and concise manner, the drawings may not necessarily be to scale and certain features may be shown in somewhat schematic form.

As used herein, the term "portable communication device" includes portable radio communication equipment. The term "portable radio communication equipment," which may be referred to below as a mobile phone, a mobile device, a mobile radio terminal or a mobile terminal, includes all electronic equipment, including, but not limited to, mobile telephones, pagers, communicators, i.e., electronic organizers, smartphones, personal digital assistants (PDAs), or the like. While the present invention is being discussed with respect to portable communication devices, it is to be appreciated that the invention is not intended to be limited to portable communication devices, and can be applied to any type of electronic equipment capable of being used for voice and/or data communication.

As will be appreciated, the invention may be used with mobile telephones, other telephones, personal digital assistants (PDA), computers, other communication devices, etc.; for brevity, the invention will be described by way of example with respect to mobile telephones, but it will be appreciated that the invention may be used with other communication devices.

Figure 1:
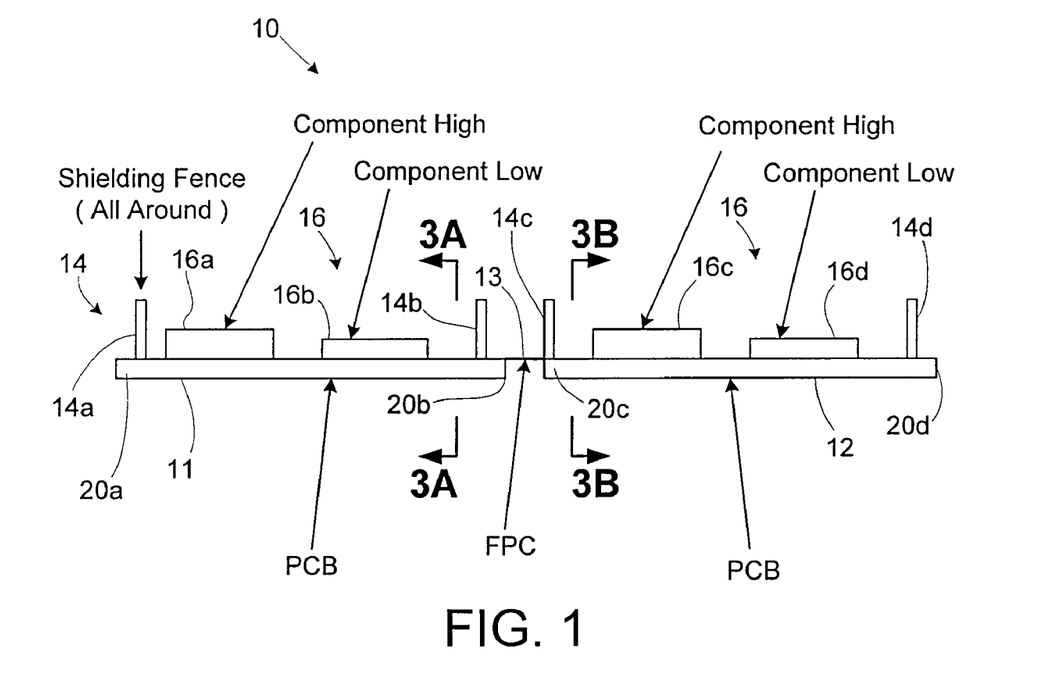
FIG. 1 is a schematic side elevation view of a pair of printed circuit boards (PCB) that are interconnected electrically and mechanically via a flexible printed circuit (FPC) for use in a shielded circuit.
Figure 2:
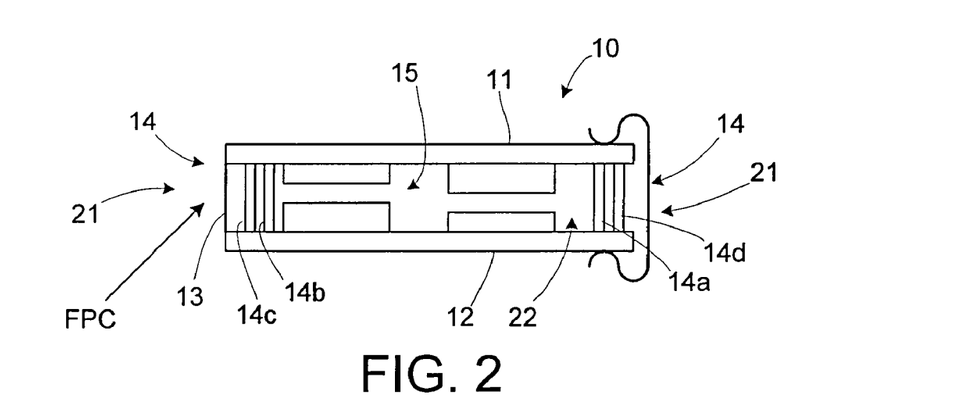
FIG. 2 is a schematic side elevation view of a shielded circuit assembly including the pair of PCBs and FPC of FIG. 1 in stacked relation such that the FPC is folded over while maintaining electrical and mechanical connection with the PCBs and placing the PCBs in substantially parallel overlying relation.

Referring in detail to the drawings, wherein like parts are designated by like reference numerals in the several drawing figures, and or in the drawings, of course, are not to scale, a shielded circuit in accordance with an embodiment of the present invention is illustrated generally at 10 in FIGS. 1 and 2. The shielded circuit includes a first circuit support structure 11, a second circuit support structure 12, a flexible connection 13 between the circuit support structures. The circuit support structures are adapted for positioning in generally overlying spaced apart relation, for example, as is illustrated in FIG. 2 and in several of the other drawing figures. The flexible connection 13 provides for electrical connection of circuits, electrically conductive traces, electrically conductive paths, etc., and electrical components associated therewith of the respective circuit support structures 11, 12.

Electromagnetic energy shielding is generally designated 14. The electromagnetic energy shielding is adapted to provide shielding of space 15 between the circuit support structures 11, 12, for example, when they are oriented in overlying spaced apart relation, such as is illustrated in FIG. 2.

One or more electrical components 16a-16d are on the circuit supports structures. The electrical components may be, for example, integrated circuits, radio modules, ASICs, memories, processors, and/or other integrated electronic components, discrete electrical components, e.g., resistors, capacitors, inductors, etc., and so forth. The electrical components collectively referred to as 16 may be mounted directly to the circuit support structures by conventional methods, such as, for example, surface mount techniques, soldering, electrically conductive adhesive, and/or any other method. The circuit support structures may be, for example, conventional printed circuit boards or the like of one layer or multiple layers. Such printed circuit boards may include one or more electrically conductive traces thereof, therein, etc. Respective contacts, terminals, and the like of the respective electrical components 16 may be electrically connected to such printed circuit traces, etc., and, as was mentioned above, electrical conductors of the flexible connection 13 also may be electrically connected to respective printed circuit traces, etc. Thus, electrical connection between respective electrical components 16 of the respective printed circuit boards 11, 12 (or other circuit support structures) may be electrically connected in an appropriate manner for desired operation, and circuits, electrical components, etc. of one printed circuit board may be electrically connected to electrical components of the other printed circuit board to provide the shielded circuit 10. The shielded circuit 10 may be used for nearly any purpose for which the electric components thereof ordinarily may be used alone or together or for new purposes, for example, in view of the compactness and shielding thereof.

As is illustrated in FIGS. 1 and 2 the form factor of the respective components is not necessarily the same. One or more components have different height dimensions. The components are positioned on the respective PCBs so that in the folded overlying relation shown in FIG. 2 one or more components having larger height dimension overlie one or more (or none) components that have a smaller height dimension, thus allowing for relatively close packing or close positioning of the respective PCBs. Therefore, more efficient use is made of the space between the PCBs than if two components having relatively larger height dimensions overlie each other.

As was mentioned above, the electric components 16 may be of different form factors, for example, they may have different respective heights, sometimes referred to as stacking height, for example, relative to the printed circuit boards 11, 12. In FIGS. 1 and 2 there are two different height electrical components on each of the printed circuit boards 11, 12. The electrical components 16a, 16c are of a higher height profile than are the electrical components 16b, 16d. For example, in some prior electrical circuit systems and devices the height range for a standard ASIC (application specific integrated circuit) was from about 0.6 to about 1.4 millimeters. However, radio modules have had a stacking height on a printed circuit used in some devices up to about 2.4 millimeters. These are exemplary values.

The arrangement of electrical components 16 on the respective printed circuit boards 11, 12 is such that the use of space 15 between the printed circuit boards when they are in the folded spaced apart overlying relation of FIG. 2, tends to be relatively optimized. Optimization in this sense may include various floor plans for the electrical components 16 on the respective printed circuit boards. In the illustrated embodiment those electrical components of one printed circuit board are located on the respective printed circuit board so as to align with a part of or all or substantially all of another electrical component on the other printed circuit board, which component has a relatively lower or smaller height profile. Although the plan view area of respective electrical components may not be entirely the same, by generally aligning relatively high profile electrical components with relatively low profile electrical components, the amount of space 15 required between the printed circuit boards 11, 12 to contain all of the electrical components tends to be minimized and the size of the shielded circuit also tends to be minimized.

The shielding 14 includes a number of electrically conductive shield plates, which are shown near or adjacent respective ends 20a-20d of the printed circuit boards 11, 12. These shield plates are identified by reference numerals 14a-14d. As is seen in FIG. 2, with the shielded circuit in folded relation such that the printed circuit boards 11, 12 are oriented in generally overlying spaced apart parallel relation, and the flexible connection 13 is bent or folded approximately 180 degrees from the orientation illustrated in FIG. 1, the shield plates 14a, 14d align in close proximity to each other, and the shield plates 14b, 14c also align in relatively close proximity to each other. Such alignment of respective pairs of shield plates provide a number of advantages, including, for example, spacing apart the respective printed circuit boards in a desired relationship, for example, providing the space 15 and separation of electrical components of one printed circuit board from those electrical components of the other printed circuit board. The parallel relationship of the shield plates also provides for a relatively strong shielded circuit 10, as there are multiple places of support of the printed circuit boards from each other. Two shield plates in a sense provide back-up shielding in the event there were a flaw in the material of one of the shield plates, for example, or in the event one of the shield plates that is mounted on one of the printed circuit boards does not come into suitably close proximity or engagement with the other printed circuit board.

Figure 3A:
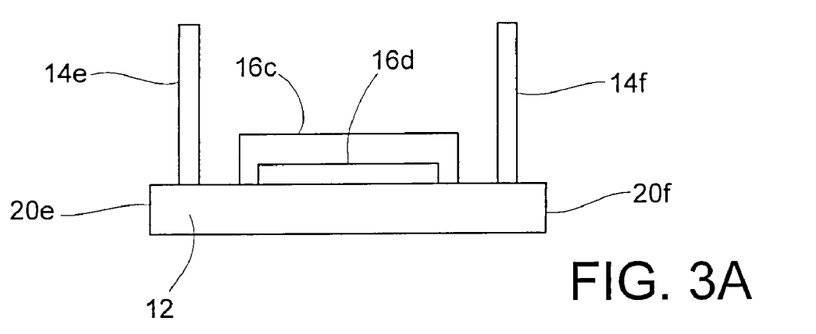
FIGS. 3A and 3B are schematic end section views looking generally in the direction of the arrows 3A-3A and 3B-3B of FIG. 1.
Figure 3B:
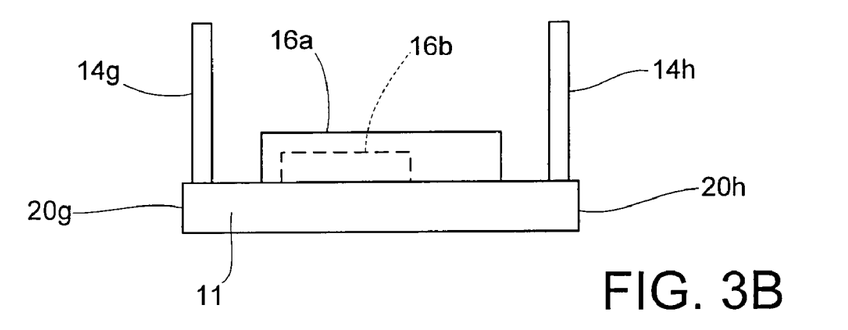

Briefly referring to FIGS. 3a and 3b, which are taken looking generally in the direction of the arrows 3A-3A and the arrows 3B-3B, respectively, of FIG. 1, shield plates 14e-14h are at the sides 20e-20h, respectively, of the printed circuit boards 11, 12. It will be appreciated that in the folded relation of the circuit support structures and flexible connections of the shielded circuit shown in FIG. 2 shielding may be provided at one or both of the ends 21 (including shield plates 14a-14b at respective ends 20a-20d (FIG. 1) and/or also one or more of the sides 22 including one or more of the sides 20e-20h and shield plates 14e-14h. The shield plates 14e-14h may align in respective parallel pairs similar to the alignment illustrated for the shield plates 14a-14d in FIG. 2.

The shielded circuit 1 may be used in a portable communications device 23, which may be a mobile telephone, personal digital assistant, or some other device, such as those mentioned above and/or other devices. The shielded circuit 10 may be used in other types of devices of electrical and/or electronic nature, including, for example, computers, televisions, and/or other devices in which it is desired to provide electric magnetic energy shielding effect in a relatively compact device.

Figures 4, 5:
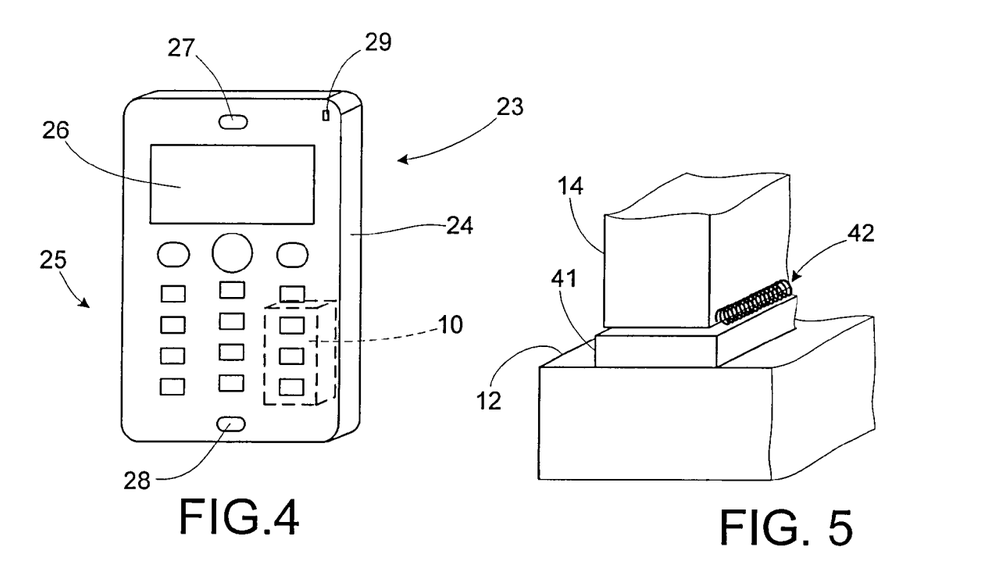
FIG. 4 is a schematic illustration of a mobile telephone having a circuit of FIGS. 1-3 therein.
FIG. 5 is a fragmentary schematic isometric view showing a shield attached to a circuit trace on a PCB.

As is seen in FIG. 4, the shielded circuit 10 is within the housing 24 of a mobile telephone 23. The mobile telephone includes, for example, various keys 25 that may be operated to operate the mobile telephone, a display 26, a speaker 27, and a microphone 28. A power on/off switch 29 also may be provided to turn on or off the various electrical circuitry functions and communication functions of the mobile telephone 23 and, thus to provide for power to and/or operation of the shielded circuit 1 in connection with the other electrical and/or electronic components, power supply, etc. of the mobile telephone 23.

Figure 3C:
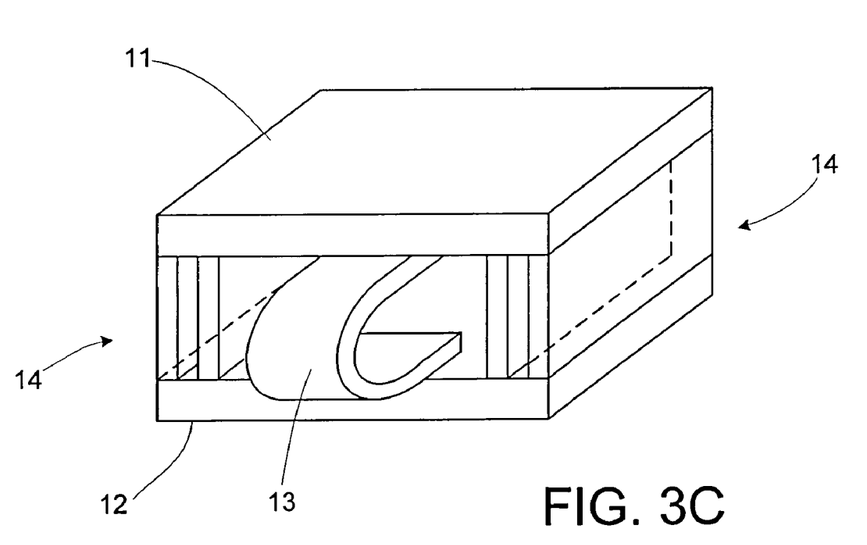
FIGS. 3C and 3D are, respectively, schematic illustrations of shielded circuit assemblies in which the printed circuit boards thereof are the same or approximately the same size and the printed circuit boards are of different sizes.

The shield plates 14a, 14e may be relatively thin strips of electrically conductive material, such as, for example, iron, aluminum, copper, or virtually any other electrically conductive material. Metal is advantageous for the shield plates, as it is relatively strong, holds its shape relatively well, and is suitably electrically conductive to provide the shielding function. The shield plates may be of other material, an example of which is described further below. The shield plates 14a-14h may be positioned in relatively upstanding relation to the printed circuit board 11, 12 to which it is attached or from which it is supported, etc. In the illustrated example the shield plates are generally planar and extend in a direction that is generally perpendicular to the major plane of the respective printed circuit board to which it is attached, for example. Other configurations of shield plates also may be used. Furthermore, the location of the shield plates relative to the sides or ends of the printed circuit boards 11, 12 may be selected in such a manner as to provide for the generally parallel alignment relationship of the shield plates in relatively close proximity to each other, for example, in the manner illustrated in FIG. 2. Thus, the shield plates may be located relatively closer or further from the respective edges or ends of the printed circuit boards to provide for the relative positioning thereof while providing shielding. For example, with reference to FIGS. 1, 2 and 3C, if the printed circuit boards 11, 12, as is shown in FIG. 3C, are of the same size, the shield plates 14a, 14b are located further spaced away from the edges of the respective ends 20a, 20b compared to the location of the shield plates 14c, 14d to the edges at the ends 20c, 20d of the printed circuit board 12. Therefore, of the shielded circuit 10 shown in FIG. 2, the shield plates 14c, 14d are relatively outside or further away from the space 15, and the shield plates 14a, 14b are relatively inside or closer to the space 15 and, in fact, directly face that space 15. The arrangement of shield plates at the sides may be similar to the arrangement of the shield plates at the ends of the respective printed circuit boards and the shielded circuit 10.

Figure 3D:
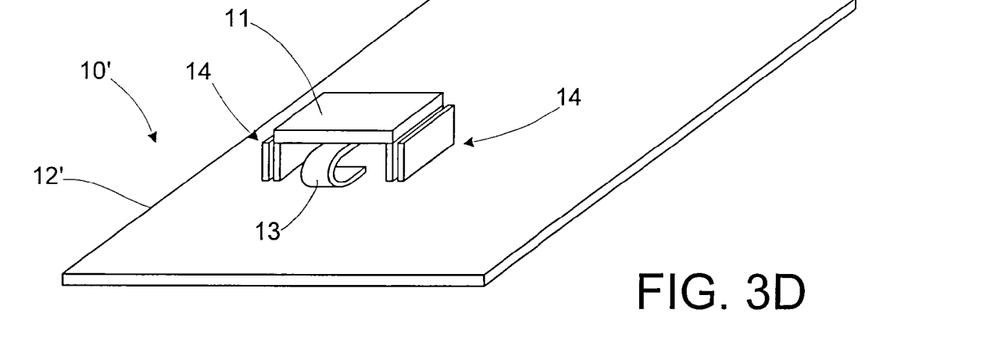

Furthermore, as is shown in FIG. 3D, the printed circuit 12' is larger than the printed circuit board 11. However, a similar arrangement of shield plates and electrical components may be provided in the shielded circuit embodiment 10' illustrated in FIG. 3D.

If desired, a spring clip 40 may be used to hold together the two printed circuit boards 11, 12 in the folded configuration of the shielded circuit 10 as shown in FIGS. 2, 3C and 3D and, if desired also at the end where the flexible connection 13 is provided. Alternatively, a lock or catch type connection may be used to hold the printed circuit boards together at one or more locations of the shielded circuit. As another example, after the printed circuit boards and flexible connection are folded as shown, adhesive may be used to adhere the shield plates of one printed circuit board to the other printed circuit board. Other approaches also may be used, if needed, to hold together the printed circuit boards in the folded overlying relation.

Figure 6:
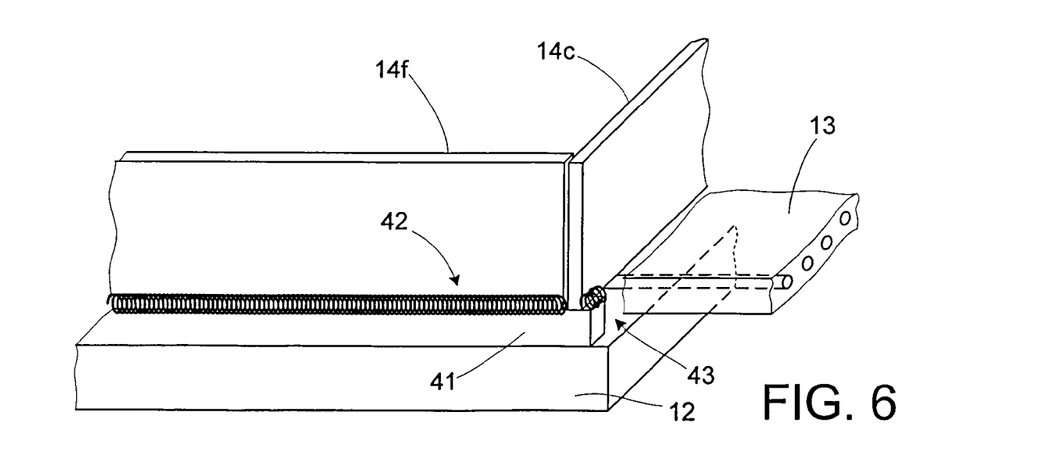
FIG. 6 is a fragmentary schematic isometric view showing the arrangement of end and side shields attached to a circuit trace on a PCB and exemplary positioning of an FPC.
Figure 7:
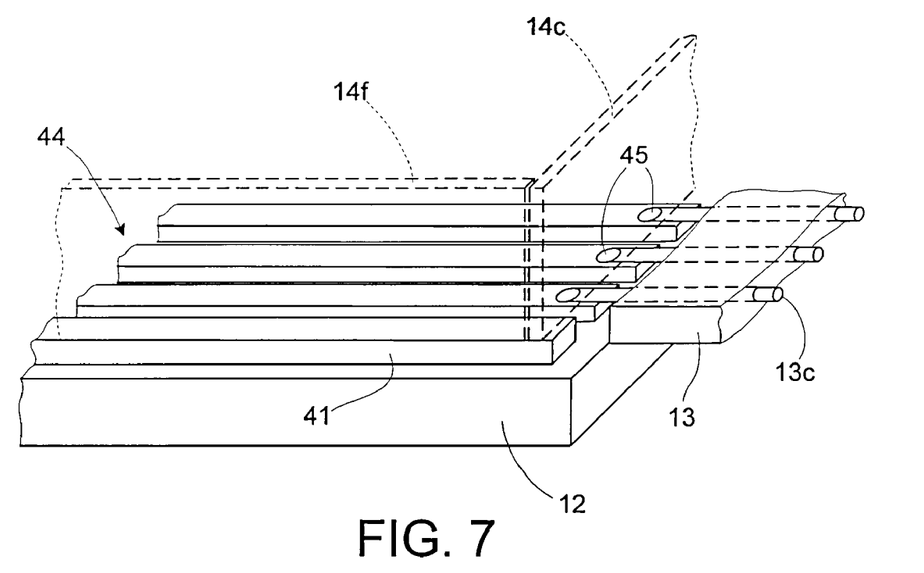
FIG. 7 is a fragmentary schematic isometric view showing the arrangement of FPC and one PCB and exemplary relative positioning of end and side shields.

As is illustrated in FIGS. 5-7, the shield plates 14a-14h may be attached to a respective printed circuit board 11, 12 by soldering to respective printed circuit traces, conductive paths or the like 41 of the printed circuit board. The printed circuit trace 41, for example, may extend the entire length of the respective printed circuit board to the full extent of the respective shield plate or may be longer or shorter. An example of solder is illustrated at 42. Other techniques, such as welding, conductive adhesive, etc., may be used to attach the shield plates or to mount them for support from and electrical connection with the printed circuit board and/or trace(s) thereof.

As is illustrated in FIG. 6, two shield plates 14 may be attached to the same printed circuit trace 41. In FIG. 6 shield plate 14f extends along the printed circuit trace 41; and shield plate 14c bridges across the printed circuit trace 41 and one or more other printed circuit traces to provide a space 43 for the electrical connection 13 to pass for connection with other printed circuit traces, plated through holes, or the like 44 of the printed circuit board 12. Examples of flexible connections include a flexible printed circuit (FPC), flexible flat cable (FFC) also referred to sometimes as flat-flex cable, or other materials that provide for a number of electrically conductive paths that are electrically insulated from each other on the one hand but provide electrical connections between respective printed circuit traces or the like of one printed circuit board to those of the other printed circuit board. Electrical insulation 13e, for example, is shown in FIG. 7 and welded connections 45 of the respective conductors 13c to printed circuit traces 44 are shown. Other types of connections to printed circuit traces also or alternatively may be used.

Figure 8:
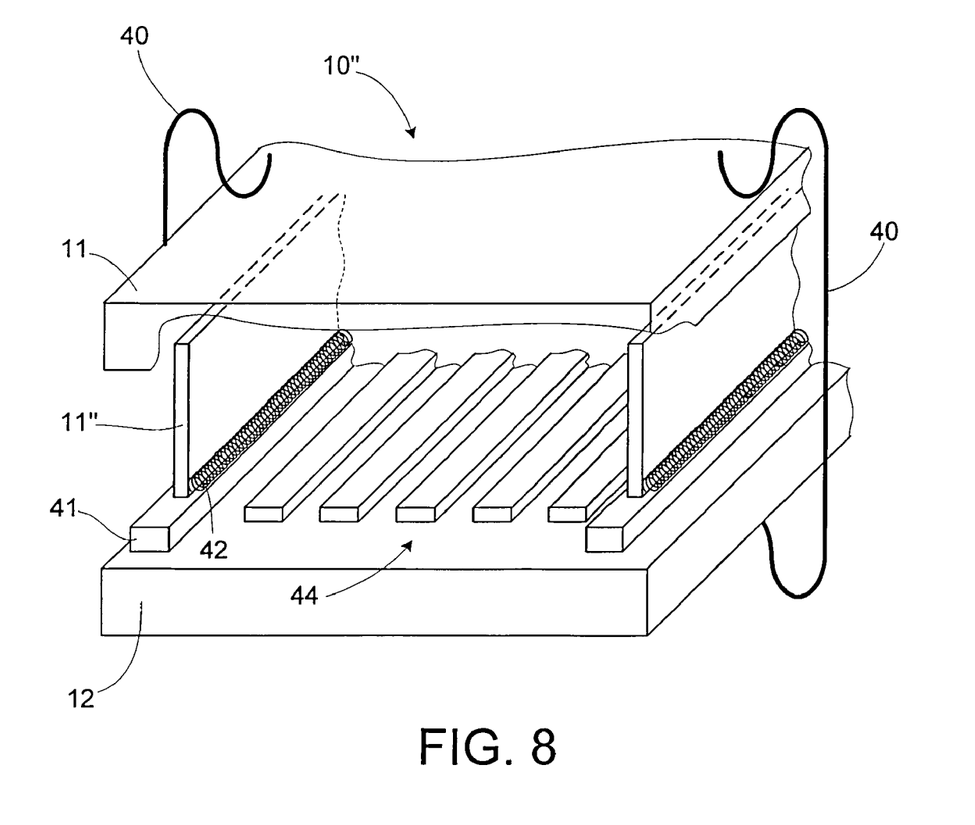
FIG. 8 is a fragmentary schematic isometric view of an embodiment of showing of shielded circuit assembly using conductive elastomer shields.

Briefly referring to FIG. 8, another embodiment 10" of shielded circuit is illustrated. In the shielded circuit 10" conductive elastomer 14' is used to provide the desired shield. The conductive elastomer 14' may be substituted for a pair of previously described relatively adjacent shield plates or, if desired a pair of conductive elastomers 14' may be used, one for each of the pair of previously described shield relatively adjacent shield plates. An example of a conductive elastomer is a foam material, resilient material, polymer material, rubber material, etc., that has therein a number of electrically conductive particles. The conductive elastomer may be electrically non-conductive when in free uncompressed state; but upon compressing the conductive elastomer, electrically conductive particles therein are placed in or suitably moved to sufficiently close proximity to one or more other electrically conductive particles as to make the conductive elastomer electrically conductive to a suitable extent to provide the desired shielding function. One or more spring clips, latches, etc. 40 may be used to hold the printed circuit boards 11, 12 of the shielded circuit 10" together and also to provide suitable compressive force on the conductive elastomer 14", e.g., to provide a squeezing effect to make the conductive elastomer electrically conductive. Conductive elastomer may be used for all shielding functions at the sides and edges of the shielded circuit 10" or for some of them, while metal plates are used for one or more other sides or edges. The conductive elastomer may be in a strip or strip-like form or shape, e.g., similar to the shield plates 14 described above. The conductive elastomer strips 14" may be adhered to one or more respective printed circuit traces 41 by soldering, electrically conductive or other means. If desired, a conductive elastomer that is suitably electrically conductive without compressing it may be used. Also, it will be appreciated that compressing the conductive elastomer between printed circuit boards helps to hold the conductive elastomer in position and also helps to fill in gaps or undulations in the printed circuit trace 41 thereby to enhance shielding.

Other types of shielding may be used for a shielded circuit in accordance with the invention. One example is a screen or screen-like material.

It is noted that in several of the drawing figures the electrical components are not shown to avoid cluttering the drawing and to facilitate illustrating the part being described.

In the description above the shielding 14 provided by the shield plates 14a-14h or by the conductive elastomer 14", etc., is shown and described with respect to the sides and ends of the shielded circuit 10. It will be appreciated that shielding also may be provided at the top 10t and bottom 10b of the shielded circuit. Such shielding at the top and bottom may be provided by using a ground plane conductive layer or the like for one or both printed circuit boards 11, 12. Moreover, although a space 43 is shown in FIG. 6 for the FPC, FFC or the like 13, it will be appreciated that the FPC, FFC or the like may include one or more conductors 13c that are connected to a ground to provide suitable electromagnetic shielding and/or the FPC, FFC or the like may include a ground plane conductor (not shown) to provide for such shielding.

Figure 9:
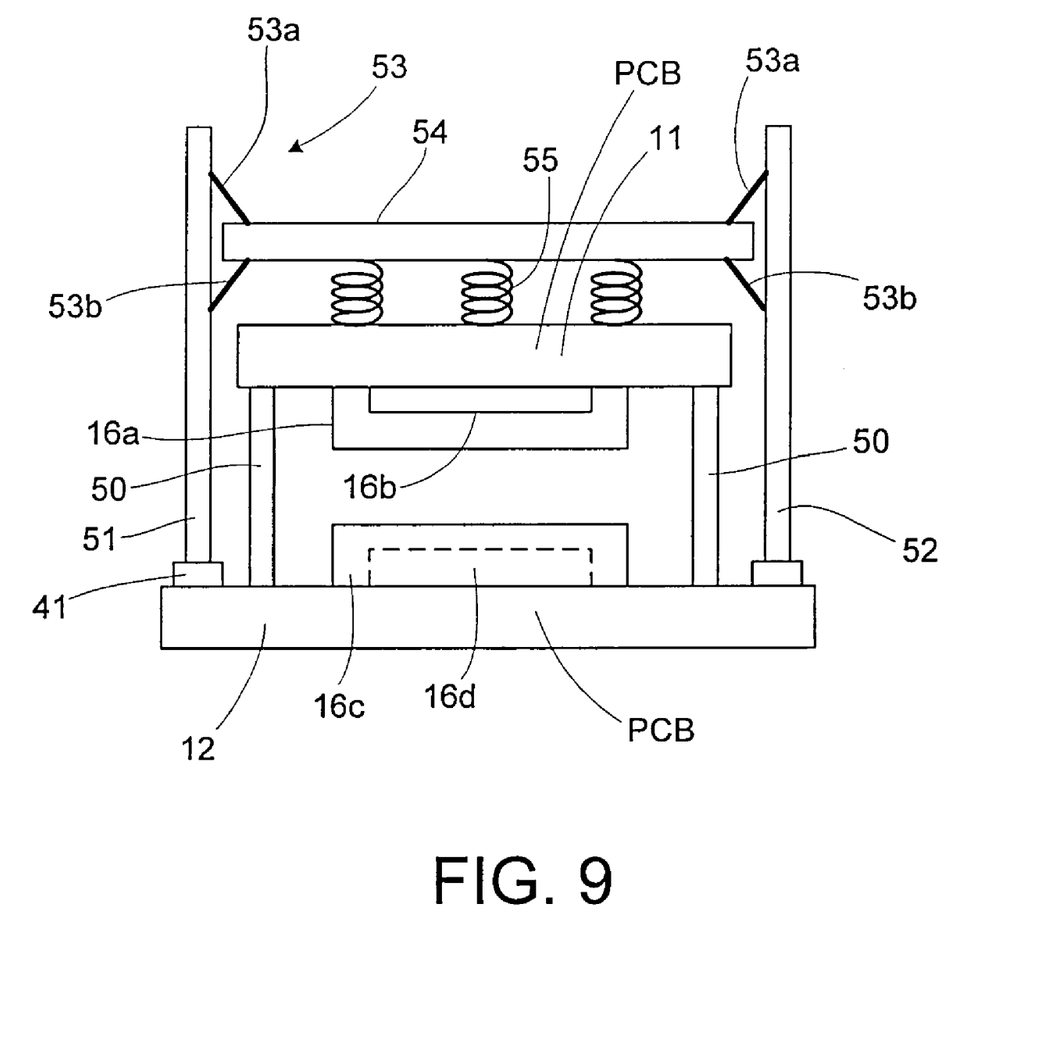
FIG. 9 is a schematic end elevation view of a pair of another embodiment of shielded circuit assembly using shields attached to one PCB and a shielding lid or cover.

Briefly referring to FIG. 9, another embodiment of shielded circuit 10'" is illustrated. In the embodiment of FIG. 9, the printed circuit board 11 is supported above the printed circuit board 12 by mounting posts 50. Alternatively, instead of the mounting posts 50, shield plates may be used to provide such support. Side shield plates 51, 52 may extend upwardly from the printed circuit board 12 and be attached at one edge to printed circuit traces 41, respectively, as was described above with respect to FIGS. 5 and 6, for example. Near the top of the side shield plates 51, 52, are spring clips 53 that hold a top shield plate 54 in place as a lid or cover above the printed circuit board 11. The spring clips may be detents cut out or pressed out from the side shield plates; and the top shield plate 54 may be held between respective pairs of such spring clips 53a, 53b, e.g., as is illustrated. One or more springs 55 or other force or pressure applying device may be used to be urged by the top shield plate 54 toward the printed circuit board 12 and may press against the printed circuit board 11 to urge it toward the mounting posts 50, for example. Although two side shield plates 51, 52 are shown, there may be corresponding edge shield plates, for example, to obtain shielding of all four sides and edges of the shielded circuit 10'" as was described above.

The shielded circuit assembly 10 may be made by positioning the first and second circuit support structures in generally overlying spaced apart relation with the shielding providing electromagnetic energy shielding of at least some of the space between the first and second circuit support structures.

Also, the shielded circuit assembly 10 may be made by positioning at least two circuit support structures in generally overlying spaced apart relation and providing electromagnetic energy shielding of at least some of the space between the first and second circuit support structures.

In the two mentioned methods, at least part of the shielding of one circuit support structure is placed in spaced apart, generally parallel adjacent relation with counterpart shielding of the other circuit support structure. In the methods conductive elastomer shielding may be placed between the two circuit boards and suitably compressed or otherwise used in electrically conductive manner.

A shielded circuit assembly includes first and second circuit support structure, such as printed circuit boards, for example, a flexible connection between the circuit support structures, e.g., a flexible printed circuit (FPC), flat flexible cable (FFC), or other connection, the first and second circuit support structures adapted for positioning in generally overlying spaced apart relation with the flexible connection providing electrical connection therebetween while having floor plans that tend to conserve space between the circuit boards or to use such space efficiently, and electromagnetic energy shielding adapted to provide shielding of space between the circuit support structures in such generally overlying spaced apart relation.

A method of making a shielded circuit assembly includes folding one printed circuit board that is flexibly attached to another printed circuit board to a generally parallel spaced apart relation and providing shielding of space between the circuit boards.

Specific embodiments of an invention are disclosed herein. One of ordinary skill in the art will readily recognize that the invention may have other applications in other environments. In fact, many embodiments and implementations are possible. The following claims are in no way intended to limit the scope of the present invention to the specific embodiments described above. In addition, any recitation of "means for" is intended to evoke a means-plus-function reading of an element and a claim, whereas, any elements that do not specifically use the recitation "means for", are not intended to be read as means-plus-function elements, even if the claim otherwise includes the word "means".

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

The invention claimed is:

1. A shielded circuit comprising
a first circuit support structure,
a second circuit support structure,
a flexible connection between the circuit support structures,
the first and second circuit support structures adapted for positioning in generally overlying spaced apart relation to define a space between said circuit support structures, with the flexible connection providing electrical connection therebetween;
at least one electrical component on at least one circuit support structure within the space; and
electromagnetic energy shielding adapted to provide shielding of the space between the circuit support structures in such generally overlying spaced apart relation,
wherein said electromagnetic energy shielding comprises a shield plate positionable between said circuit support structures shielding the space between said circuit support structures.

2. The circuit of claim 1, at least one of said circuit supports is a printed circuit board.

3. The circuit of claim 1, said flexible connection comprises a flexible printed circuit.

4. The circuit of claim 3, said flexible printed circuit comprises a flexible printed circuit integral with at least one of said circuit supports.

5. The circuit of claim 1, said flexible connection comprises a flexible flat cable.

6. The circuit of claim 1, wherein at least one of said circuit support structures comprising multi-layer circuit board, and wherein at least a portion of at least one of the layers of the multi-layer circuit board is a ground plane.

7. The circuit of claim 1, further comprising at least one electrical component on each of said circuit support structures.

8. The circuit of claim 7, wherein at least one of said circuit support structures has a plurality of electrical components thereon, and wherein the electrical components are located on said circuit support structures in relative relation to tend to minimize the spacing requirements between said circuit support structures.

9. The circuit of claim 8, wherein the height dimension of at least one of said electrical components on one of said circuit support structures is greater than the height dimension of another of said electrical components on said one of said circuit support structures.

10. The circuit of claim 9, wherein the height dimension of at least one of said electrical components on the other of said circuit support structures is greater than the height dimension of another of said electrical components on said other of said circuit support structures.

11. The circuit of claim 10, wherein with the circuit support structures in spaced apart overlying relation such that electrical components said circuit support structures face each other, at least one electrical component having a relatively greater height dimension on one of said circuit support structures is at least partly aligned with an electrical component having a relatively smaller height dimension on the other of said circuit support structures.

12. The circuit of claim 1, said shield plate comprising a plurality of shield plates at least one at each of the sides of said circuit support structures and generally upstanding from the respective circuit support structure.

13. The circuit of claim 12, said shield plates comprising a shield plate at each of the sides and ends of said circuit support structures, and wherein at least one of the shield plates of each circuit support structure are positionable in generally parallel adjacent relation to each other to cooperate in providing electromagnetic energy shielding effect.

14. The circuit of claim 1, said shielding comprising electrically conductive plates.

15. The circuit of claim 1, said shielding comprising a conductive elastomer.

16. The circuit of claim 15, said conductive elastomer comprising an elastomer material having therein electrically conductive particles, said elastomer being compressible to bring said particles in sufficient relative proximity to make the conductive elastomer electrically conductive, and further comprising a holder to hold said circuit support structures in relative relation to compress said conductive elastomer to provide suitable electrical conductivity.

17. The circuit of claim 1, electrically conductive traces or strips on at least one of said circuit support structures, and said shielding comprising an electrically conductive member electrically attached to at least one of said traces or strips.

18. The circuit of claim 1, said shielding comprising at least one shield on each of said circuit support structures extending away from the respective circuit support structures and adapted for generally adjacent parallel alignment with respect to a corresponding shield on the other circuit support structure.

19. The circuit of claim 18, wherein there are at least two shields on each circuit support portion, the shields on one of said circuit support portions being proximate to and parallel to opposite side edges thereof.

20. The circuit of claim 18, wherein said one of said circuit support structures is larger than the other.

21. The circuit of claim 1, wherein at least one of the circuit support structures includes thereon an electrical component having a height up to 2.4 mm (millimeters).

22. The circuit of claim 1, wherein two circuit support structures and the flexible connection are formed in generally flat planar relation and are bent approximately 180 degrees to align the circuit support structures in generally parallel spaced apart overlying relation.

23. The circuit of claim 1, wherein a circuit component on at least one circuit support structure comprises a radio module.

24. The circuit of claim 1, wherein the shielded circuit is in an electronic communications device.

25. A mobile telephone comprising the shielded circuit of claim 1.

26. A method of making a shielded circuit assembly that includes first and second circuit support structures, at least one electrical component on at least one of said circuit support structures, a flexible connection therebetween, and shielding carried by at least one of the circuit support structures, said shielding comprising a shield plate, comprising
positioning the first and second circuit support structures in generally overlying spaced apart relation to define a space between said first and second support structures with the electrical component within the space and with the shield plate positioned between said first and second support structures providing electromagnetic energy shielding of at least some of the space between the first and second circuit support structures.

27. A method of making a shielded circuit assembly that includes a plurality of circuit support structures, at least one electrical component and a flexible connection between at least a pair of circuit support structures, comprising positioning at least two circuit support structures in generally overlying spaced apart relation to define a space therebetween, with said at least one electrical component on one of the two circuit support structures within the space, and positioning a shield plate between said at least two circuit support structures to provide electromagnetic energy shielding of at least some of the space between the first and second circuit support structures.

28. The method of either of claim 27, comprising placing at least part of the shielding of one circuit support structure in spaced apart, generally parallel adjacent relation with counterpart shielding of the other circuit support structure.

29. The method of claim 27, wherein the shielding is provided by conductive elastomer and applying pressure to the conductive elastomer or otherwise using it in electrically conductive mode to provide shielding.

* * * * *